(12) United States Patent
Lesperance et al.

(10) Patent No.: US 11,675,012 B2
(45) Date of Patent: Jun. 13, 2023

(54) DETECTION OF PARTIAL DISCHARGE

(71) Applicant: GM GLOBAL TECHNOLOGY OPERATIONS LLC, Detroit, MI (US)

(72) Inventors: Ronald M Lesperance, Troy, MI (US); John S Agapiou, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/448,990

(22) Filed: Sep. 27, 2021

(65) Prior Publication Data
US 2023/0115294 A1 Apr. 13, 2023

(51) Int. Cl.
*G01R 31/00* (2006.01)
*G01R 31/34* (2020.01)
*G01R 31/12* (2020.01)

(52) U.S. Cl.
CPC ....... *G01R 31/343* (2013.01); *G01R 31/1227* (2013.01)

(58) Field of Classification Search
CPC ............ G01R 31/1227; G01R 31/1209; G01R 31/34; G01R 31/346; G01R 31/343
See application file for complete search history.

(56) References Cited

U.S. PATENT DOCUMENTS

| 6,323,658 | B1* | 11/2001 | Kendig | G01R 31/343 324/551 |
| 6,452,416 | B1* | 9/2002 | Kaneda | G01R 31/1263 219/69.18 |
| 8,779,928 | B2* | 7/2014 | Ganesh | G01R 31/343 340/650 |
| 2005/0012507 | A1* | 1/2005 | Kaneda | G01R 31/343 324/536 |
| 2015/0015303 | A1* | 1/2015 | Sakurai | G01R 19/0084 324/765.01 |
| 2015/0073733 | A1* | 3/2015 | Agapiou | G01R 31/343 702/58 |
| 2016/0216309 | A1* | 7/2016 | Kojima | G01R 31/08 |
| 2017/0038424 | A1* | 2/2017 | Ikegami | G01R 31/1272 |
| 2020/0228045 | A1* | 7/2020 | Kawai | H02P 29/024 |

* cited by examiner

Primary Examiner — Thang X Le
(74) Attorney, Agent, or Firm — Lorenz & Kopf LLP

(57) ABSTRACT

Methods and systems for detecting partial discharge in a stator for an electric motor are provided. An exemplary method includes applying a high voltage AC sinewave input signal to the stator and energizing at least one winding therein. The method includes sensing a first resulting load signal occurring in the stator with a first device and filtering the first resulting load signal to form a first high frequency signal indicating any partial discharge (PD) voltage occurring in the stator. The method also includes sensing a second resulting load signal occurring in the stator with a second device and filtering the second resulting load signal to form a second high frequency signal indicating any partial discharge voltage occurring in the stator. Further, the method includes processing the first and second high frequency signals to form a processed signal indicating whether partial discharge occurred.

20 Claims, 3 Drawing Sheets

DETECTION OF PARTIAL DISCHARGE

INTRODUCTION

The technical field generally relates generally to an inspection system for evaluating electrical parts and, more particularly, to such methods and systems for detecting partial discharge that may occur in parts such as stators for electrical motors.

Many electrical parts include insulation, such as enamel or other primary insulation, close-coupled, or sheathed, over wires. Many also include a secondary insulation, such as a varnish provided over the sheathing.

When complete, the insulation keeps electrical current from occurring in the wire undesirably. When flaws are present in both layers, such as by the primary insulation being too thin in an area adjacent an air bubble in the secondary insulation, unwanted partial discharge (PD) may result. A partial discharge may occur, for example, in such an air bubble.

Numerous challenges exist in identifying problematic flaws effectively and efficiently. A primary challenge is that traditional techniques often fail to easily and adequately test all portions or only selected portions of the stator beyond the first few windings.

Accordingly, it is desirable to provide methods and systems for detecting partial discharge throughout all windings in a stator of an electric motor or through only a selected winding or hairpin therein. In addition, it is desirable to provide methods and systems for detecting partial discharge using inexpensive and commercially available devices. Furthermore, other desirable features and characteristics of embodiments will become apparent from the subsequent detailed description and the appended claims, taken in conjunction with the accompanying drawings and the foregoing technical field and background.

SUMMARY

Methods and systems for detecting partial discharge, such as in a stator for an electric motor, are provided. An exemplary method includes applying a high voltage AC sinewave input signal to the stator and energizing at least one winding therein. The method includes sensing a first resulting load signal occurring in the stator with a first device and filtering the first resulting load signal to form a first high frequency signal indicating any partial discharge voltage occurring in the stator. The method also includes sensing a second resulting load signal occurring in the stator with a second device and filtering the second resulting load signal to form a second high frequency signal indicating any partial discharge voltage occurring in the stator. Further, the method includes processing the first high frequency signal and the second high frequency signal to form a processed signal indicating whether partial discharge occurred.

In certain embodiments of the method, the first device is a high pass filter having a root mean square (rms) voltage rating of at least 3 kilovolts (KV) that receives the high voltage AC sinewave input signal. The first high frequency signal indicates any partial discharge voltage occurring in the stator based on the high voltage AC sinewave input signal received and on the first resulting load signal.

In certain embodiments of the method, the second device is an antenna, such as an ultra high frequency (UHF) antenna.

In certain embodiments of the method, a first high pass filter is used for filtering the first resulting load signal to form the first high frequency signal. A second high pass filter is used for filtering the second resulting load signal to form the second high frequency signal.

In certain embodiments of the method, a digitizer is used for processing the first high frequency signal and the second high frequency signal to form the processed signal indicating whether partial discharge occurred.

In certain embodiments of the method, applying the high voltage AC sinewave input signal to the stator and energizing at least one winding therein includes energizing each winding in the stator with the high voltage AC sinewave input signal. In certain other embodiments of the method, applying the high voltage AC sinewave input signal to the stator and energizing at least one winding therein includes applying the high voltage AC sinewave input signal to a single selected hair pin before it is welded in the stator or before it is inserted in the stator and energizing only the single selected hair pin.

In certain embodiments, the method further includes generating an AC sinewave input signal with an AC function generator; and amplifying the AC sinewave input signal to an increased voltage to form the high voltage AC sinewave input signal. In certain embodiments, the AC sinewave input signal may be generated with a frequency of about 60 Hz to 1,000 Hz. In certain embodiments, the AC sinewave input signal is generated with a voltage of less than 10 volts, and the amplifier amplifies the AC sinewave input signal to greater than 100 volts.

In certain embodiments, when the processed signal does not indicate that partial discharge has occurred, the method further includes repeating the method with the high voltage AC sinewave input signal at an increased voltage. Further, in certain embodiments, when the processed signal indicates that partial discharge has occurred, the method further includes identifying the increased voltage of the high voltage AC sinewave input signal that was applied when partial discharge occurred.

In another exemplary embodiment, a method for detecting a partial discharge in a stator for an electric motor is provided. The method includes selectively applying a high voltage AC sinewave input signal to the stator to either energize each winding in the stator with the high voltage AC sinewave input signal or to energize a single selected hair pin before it is welded in the stator. The method further includes sensing a first resulting load signal occurring in the stator and filtering the first resulting load signal to form a first high frequency signal. Also, the method includes sensing a second resulting load signal with an antenna and filtering the second resulting load signal to form a second high frequency signal. The method includes processing the first high frequency signal and the second high frequency signal to form a processed signal indicating whether partial discharge occurred.

In certain embodiments of the method, when the processed signal does not indicate that partial discharge has occurred, the method is repeated with the high voltage AC sinewave input signal at an increased voltage. Further, in certain embodiments of the method, when the processed signal indicates that partial discharge has occurred, the method further includes identifying the increased voltage of the high voltage AC sinewave input signal that was applied when partial discharge occurred.

In another exemplary embodiment, a system for detecting a partial discharge in a stator for an electric motor is provided. The system includes a stator lead configured to apply a high voltage AC sinewave input signal to the stator to energize at least one winding therein. Further, the system includes a first device configured to sense a first resulting load signal occurring in the stator; and a second device configured to sense a second resulting load signal occurring in the stator. Also, the system includes a module for processing the first resulting load signal and the second resulting load signal to form a processed signal indicating whether partial discharge occurred.

In certain embodiments, the system further includes an AC function generator configured to generate an AC sinewave input signal; and an amplifier configured to receive and amplify the AC sinewave input signal to an increased voltage to form the high voltage AC sinewave input signal.

In certain embodiments of the system, the first device is a first high pass filter and the second device is an antenna.

In certain embodiments of the system, the module for processing the first resulting load signal and the second resulting load signal to form the processed signal indicating whether partial discharge occurred includes a first high pass filter. The first high pass filter receives the high voltage AC sinewave input signal; receives the first resulting load signal; and filters the first resulting load signal to form a first high frequency signal indicating any partial discharge voltage occurring in the stator based on the high voltage AC sinewave input signal received and on the first resulting load signal. A second high pass filter filters the second resulting load signal to form a second high frequency signal indicating any partial discharge voltage occurring in the stator. A digitizer processes the first high frequency signal and the second high frequency signal to form the processed signal indicating whether partial discharge occurred. In such embodiments, the system may further include an AC function generator configured to generate an AC sinewave input signal; an amplifier configured to receive and amplify the AC sinewave input signal to an increased voltage to form the high voltage AC sinewave input signal; and a controller configured to communicate with and control the AC function generator, the amplifier, the first device, the second device, the first high pass filter, the second high pass filter, and the digitizer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
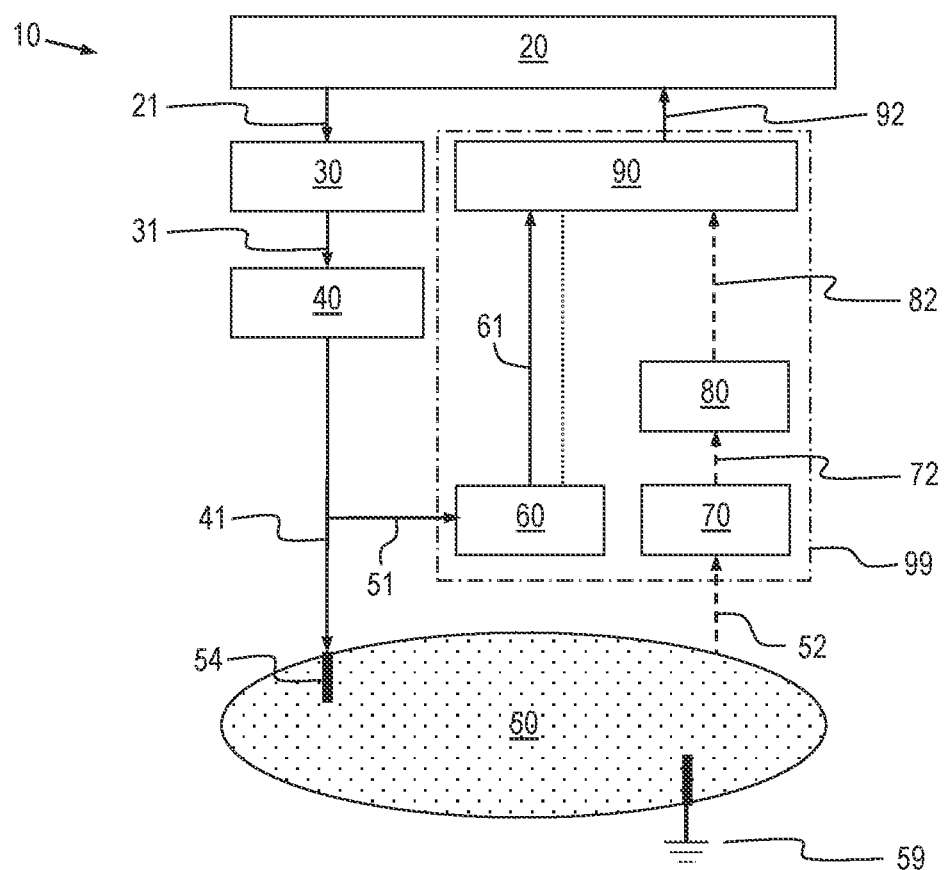
FIG. 1 is a schematic illustration of a system for detecting partial discharge of a stator for an electric motor for a vehicle, in accordance with various embodiments.

The following detailed description is merely exemplary in nature and is not intended to limit the application and uses. Furthermore, there is no intention to be bound by any expressed or implied theory presented in the preceding technical field, background, brief summary or the following detailed description.

As used herein, the term module refers to an application specific integrated circuit (ASIC), an electronic circuit, a processor (shared, dedicated, or group) and memory that executes one or more software or firmware programs, a combinational logic circuit, and/or other suitable components that provide the described functionality.

As used herein, the word "exemplary" means "serving as an example, instance, or illustration". As used herein, "a," "an," or "the" means one or more unless otherwise specified. The term "or" can be conjunctive or disjunctive. Open terms such as "include," "including," "contain," "containing" and the like mean "comprising." In certain embodiments, numbers in this description indicating amounts, ratios of materials, physical properties of materials, and/or use may be understood as being modified by the word "about". The term "about" as used in connection with a numerical value and the claims denotes an interval of accuracy, familiar and acceptable to a person skilled in the art. In general, such interval of accuracy is ±10%. All numbers in this description indicating amounts, ratios of materials, physical properties of materials, and/or use may be understood as modified by the word "about," except as otherwise explicitly indicated.

The figures are in simplified schematic form and are not to precise scale. Further, terms such as "upper", "lower", "above," "over," "below," "under," "upward," "downward," et cetera, are used descriptively of the figures, and do not represent limitations on the scope of the subject matter, as defined by the appended claims. Any numerical designations, such as "first" or "second" are illustrative only and are not intended to limit the scope of the subject matter in any way. It is noted that while embodiments may be described herein with respect to automotive applications, those skilled in the art will recognize their broader applicability.

Embodiments herein are related to the testing of electrical components, such as electric motors, and more specifically of stators in electric motors, such as may be used in vehicles or other applications. In exemplary embodiments, the electric motors are permanent-magnet direct current (DC) motors that operate using impulses, i.e., pulsed direct current (DC), to drive vehicles. Embodiments include integrated inspection methods and systems that use high voltage alternating current (AC) for partial discharge detection. The methods and systems integrate the application of the test signal and the detection of the resulting signal that is evaluated for partial discharge. In exemplary embodiments, a continuous AC sinewave input signal is applied to the stator rather than a pulsed signal. In methods and systems described herein, the continuous AC sinewave input signal may be used to determine whether partial discharge is occurring throughout the full windings of the stator by sending a specified number of sinewaves through the full windings and by using sensors to pick up signals indicative of partial discharge. Thus, the methods and systems described herein may test for partial discharge or insulation defects throughout the stator. An exemplary embodiment incorporates a function generator and amplifier to generate a high voltage AC sinewave test signal; two sensors to detect partial discharge, such as a high pass electronic filter and an antenna; a high speed digitizer; and a controller operating a program integrating these devices and controlling the functionality of the system. Unlike pulsed signals, the continuous high voltage AC sinewave test signal is able to penetrate and energize the full windings of the stator such that partial discharge may be located anywhere in the stator windings.

Further, the same methods and systems described herein may be designed to test only a single winding or single hairpin in the stator by sending a specified number of sinewaves through, and energizing, the single winding or hairpin and by using sensors to pick up signals indicative of partial discharge. Thus, insulation performance at a specific individual winding or hairpin may be evaluated.

FIG. 1 is a basic diagram of an exemplary embodiment of a system 10 for detecting partial discharge of a stator 50 for an electric motor for a vehicle, such as for use in a testing process during manufacture of a vehicle. As shown, the system 10 includes a computer or controller 20 in communication with a function generator 30; an amplifier 40; a stator lead 54; a device 60, such as a sensor, and may include a filter, such as an electronic high pass filter; a device 70, such as a sensor, which may be an antenna; a filter 80, such as a second high pass filter 80; and a high speed digitizer 90. In operation, because the system 10 integrates multiple devices, each of which may be a sub-system, or at least receives input from one or more of the devices, it may in some instances be referred to as an integrated system 10.

The computer 20 includes at least one software program supporting operations of the present technology including, for instance, integrating operation of system components 30, 40, 60, 70, 80, and 90. The computer 20 may be referred to by other terms, such as a controller sub-system, a computing sub-system, etc.

The function generator 30 is configured to generate a specified number of sinewaves in a continuous, i.e., non-pulsed, alternating current (AC) signal 31 at a selected frequency and selected voltage for input to the stator 50 being tested. The function generator 30 may be referred to by other terms, such as a voltage source, source voltage sub-system, voltage instrument, simply as the source, or the like. The function generator 30 may be single or multi-channel. The multi-channel version includes a channel corresponding to each phase in the stator 50. The single-channel version provides output for each of the phases of the stator 50, in turn.

In a contemplated embodiment, the function generator 30 is controlled at least in part by the computer 20. The computer 20 may be connected directly, as shown in FIG. 1, or indirectly to the function generator 30. In an exemplary embodiment, the function generator 30 receives an instruction or command 21 from the computer 20 to provide the desired signal 31. In an exemplary embodiment, the signal 31 has a frequency of about 60 Hz. This frequency can typically range from 1 Hz to 1000 Hz. Generally, if the frequency is too high, then it resembles a pulse and loses the winding penetrating capabilities of lower frequencies. In an exemplary embodiment, the signal 31 has a voltage range of less than 10 volts (V) typically from −5 volts to +5 volts.

In FIG. 1, the signal 31 is amplified by amplifier 40 to form a high voltage AC sinewave input signal 41. The amplifier 40 receives an instruction or command, that may ride on signal 31, from the computer 20 to amplify signal 31 to form the amplified signal 41 at a desired high voltage. In an exemplary embodiment, the amplified signal 41 has a voltage of greater than 100 V, such as greater than 300 V, for example from 300 V to 2500V. The voltage needed depends on the stator under test and currently can go as high as 5000V. Generally, testing may be used to approve a stator that does not exhibit partial discharge at a voltage at a selected value higher than the motor's expected operating voltage. For example, a stator of a motor that will operate at 300 V may be tested with an input signal of 600 V, two times the operating voltage, or 1600 V (in general the setup is two times the operating voltage plus 1000 V). If such stator does not exhibit partial discharge at 1600 V, it may be considered to have passed the partial discharge testing process. As described below, in certain embodiments, the amplifier 40 amplifies the signal from signal generator 30 and the signal generator 30 may be controlled by the controller 20 to incrementally increase the voltage of input signal 41 during successive testing procedures until partial discharge is detected.

As shown in FIG. 1, the signal 31, as amplified to high voltage signal 41, is applied to a stator input terminal or lead 54 that is connected at a selected location on a winding of the stator 50, such as at selected stator phase leads. As shown, a selected location of the winding of the stator 50 is connected to ground 59. Upon applying the voltage to the stator lead 54, at least one winding within the stator 50 is energized. Certain embodiments are arranged such that the entire winding is energized. Other embodiments are arranged such that only a single winding or only a single hairpin is energized (evaluating single hairpins before it is welded or inserted in the stator). It is contemplated that any selected portion of the stator winding may be energized and tested, from one hairpin to the entire winding.

If the selected portion of the winding has major flaws in its insulation, for example in an enamel sheathing and/or a proximate varnish coating, the resulting load signal will tend to exhibit major partial discharge. The voltage at which partial discharge occurs is called the partial discharge inception voltage (PDIV). Larger flaws are more likely to discharge, and to discharge more, when exposed to continued use.

FIG. 1 illustrates that a received load signal 51, i.e., a signal resulting from the energization of the selected portion of the winding, is sensed by device 60. If partial discharge occurs, then the resultant signal is reflected onto the high voltage signal 41 and sensed by 60. This reflected signal is seen high-frequency noise riding on top of the original high voltage signal. In an exemplary embodiment, device 60 is both a sensor and a filter, such as an electronic high pass filter. FIG. 1 illustrates that the signal 31, as amplified to high voltage signal 41, is received by the device 60. The device 60 identifies the noise signal riding on top of the input signal 41 within the received load signal 51. Further, the device 60 filters out the underlying input signal 41 to form a first high frequency signal 61 indicating any partial discharge voltage occurring in the stator 50.

Figure 2:
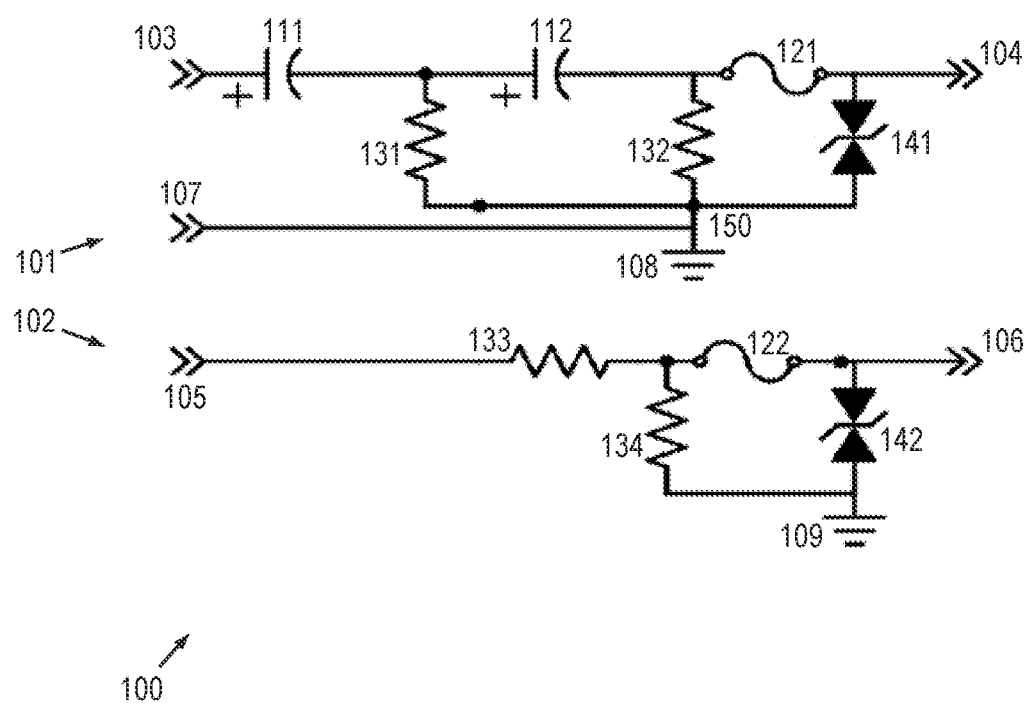
FIG. 2 is a schematic illustration of a device including a high pass filter for use in the system of FIG. 1.

In an exemplary embodiment, the device 60 is a special high pass filter that has high voltage components and is designed with a root mean square (rms) voltage rating of at least 2 KV, such as 3 KV or at least 3 KV. FIG. 2 illustrates a circuit design 100 for an exemplary device 60 for use in the system 10 of FIG. 1. In the circuit design 100 for the device 60, a high pass filter 101 and a voltage divider 102 are provided. The high pass filter 101 receives a terminal voltage 103 and generates a filtered partial discharge signal 104. The voltage divider 102 receives an actual high voltage 105 and generates a scaled voltage 106 that can been read by the digitizer (90 in FIG. 1). The circuit design includes a system ground 107, ground 108, and ground 109.

As shown, in the high pass filter 101, a first capacitor 111, a second capacitor 112, and a first fuse 121 are arranged in series. A first resistor 131 is connected at a location between the capacitors 111, 112; a second resistor 132 is connected at a location between capacitor 112 and fuse 121; and a first bidirectional zener diode 141 is connected at a location after the fuse 131. Each is connected to common node 150 which is also connected to ground. With such a design, a partial discharge signal with frequencies above 20 MHz can be separated from an applied voltage test signal with a given frequency from 1 to 1000 Hz. The parameters of the filter 60 are chosen such that attenuation of the high frequency signal is the minimum, allowing high partial discharge strength at the output of the filter.

As shown, in the voltage divider 102, a third resistor 133 and second fuse 122 are arranged in series. Further, a fourth resistor 134 is connected at a location between the third resistor 133 and second fuse 122. A second bidirectional zener diode 142 interconnects a location after the second fuse 122 and after the fourth resistor 134, and is further grounded. With this layout, the voltage divider 102 can receive the actual high voltage 105 and reduce it down to the scaled voltage 106 for use by the system 10 of FIG. 1.

Referring back to FIG. 1, as shown, a second received load signal 52, i.e., a signal resulting from the energization of the selected portion of the winding, is sensed by device 70. In an exemplary embodiment, device 70 is a sensing device such as an antenna. For example, device 70 may be a UHF antenna.

As shown, the device 70 communicates the received signal as input 72 to the filter 80. An exemplary filter 80 is an electronic high pass filter. Filter 80 filters out any portion of received signal 72 that results from the applied input signal 31 or 41 to form a filtered high frequency signal 82.

In operation, each of the device 60, embodied as a filter, and the filter 80, passes on only those frequencies received from the stator 50 in signals 51 and 52 that are sufficiently faster than the high voltage AC signal 41. Each device/filter 60 and 80, in other words rejects the original high voltage frequencies, thereby filtering the signal voltage from the part-output voltage.

In one embodiment, each device/filter 60 and 80 is configured to perform local operations including the following: receiving an original input voltage 41 that is sent to the stator 50, or otherwise accessing data indicating such voltage (e.g., from a voltmeter or multimeter positioned between the source 30 and the stator 50; (ii) receiving a resulting load voltage 51 or 52 occurring in the stator 50, or otherwise accessing data indicating such voltage (e.g., from a voltmeter or multimeter positioned between the stator 50 and the respective device 60 or 70, or from antenna device 70); and (iii) identifying, based on the original input signal 41 and the resulting load voltage levels 51 and 52, any partial discharge voltage occurring in the stator 50. The operations further include (iv) providing, to the high-speed digitizer 90, a signal 61 or 82 including any voltage identified.

In exemplary embodiments, any output voltage is identified by subtracting, or filtering, the original input voltage 41 from the load voltage 51 or 52. If there is no appreciable noise, or difference, between the voltage input 41 to and output 51 or 52 from the stator 50.

In other words, the filter passes on only those frequencies received from the part that are sufficiently faster than input signal 41, thereby filtering out, or rejecting, the original signal. Essentially, any partial discharge event would add a high-frequency noise on top of the signal leaving the stator 50 or generate an electromagnetic signal that can be detected by an antenna 70.

Any difference sensed is noise, and noise from a partial discharge would have a very high frequency, e.g., a very high frequency voltage pattern. The frequency of partial discharge noise may be, e.g., any frequency greater than about 20 MHz. Presence of such very high frequency oscillation, separated out by the filter, indicates an unwanted partial discharge event, and thus that the portion of the stator 50 under testing is flawed, e.g., has insufficient electrical insulation.

In some implementations, the partial discharge signal represents a voltage pattern having decaying oscillation and/or a decaying magnitude. While the partial discharge signal may represent higher or lower frequencies, in one embodiment the frequency is about twenty megahertz (20 MHz) but it can go higher, such as to 100 MHz.

A designer of the system may pre-establish desired system settings, such as applied voltage and the threshold noise amplitude, to define what severity of flaw and partial discharge will be considered problematic, or at least suspect, in the testing.

As shown, digitizer 90 receives the filtered high frequency signal 61 and the filtered high frequency signal 82. The digitizer 90 may be embodied in various forms, such as a digitizing device or a digitizer sub-system. In some embodiments, the digitizer is relatively high-speed, and so may be referred to as a high-speed digitizer. Because a primary function of the digitizer 90 is to acquire and process data, it may be referred to as a data-acquisition device or sub-system, a data acquisition and high-speed digitizing sub-system, or a similar device/system. Because a primary function of the digitizer 90 is to analyze the data, it may be referred to as a high-speed analyzer, analyzing sub-system, or the like. Combining these functions, some embodiments of the digitizer may be referred to as a digitizing and analyzing device or sub-system, a high-speed digitizing-and-analyzing device or sub-system, etc.

In a first process local to the digitizer 90, the digitizer receives the partial discharge voltage signals 61 and 82 transmitted from the devices/filters 60 and 80. In a second process local to the digitizer 90, the digitizer 90 processes the received partial discharge voltage data. In some embodiments, the processing includes analog-to-digital (ADC) processing, converting a received analog signal to a corresponding digital signal having generally the same data basis. In a third process local to the digitizer 90, the digitizer 90 provides the processed signal to the computer.

The digitizer 90, in one embodiment, has three channels. One is connected to receive the filtered signal 61, one is connected to receive filtered signal 82, i.e., the two partial discharge signals indicating any noise in the stator-output voltage. The other channel is connected to receive the input signal in the form of the original input signal 41 and the reduced voltage produced by the voltage divider circuit 102 shown in FIG. 2. The digitizer 90 may pass the peak amplitude of the filtered signals 61 and 82 to the computer 20 as a processed signal 92 for analysis.

As illustrated, the system 10 includes a module 99 for processing the first resulting load signal 51 and the second resulting load signal 52 to form the processed signal 92 indicating whether partial discharge occurred. The module 99 includes the first high pass filter 60 configured to: receive the high voltage AC sinewave input signal 41; receive the first resulting load signal 51; and filter the first resulting load signal 51 to form a first high frequency signal 61 indicating any partial discharge (PD) voltage occurring in the stator 50 based on the high voltage AC sinewave input signal 51. The module 99 further includes the second high pass filter 80 configured to filter the second resulting load signal 52 to form a second high frequency signal 82 indicating any partial discharge voltage occurring in the stator 50. Also, the module 99 includes the digitizer 90 configured to process the first high frequency signal 61 and the second high frequency signal 82 to form the processed signal 92 indicating whether partial discharge occurred. Though not illustrated, the module 99 may be considered to also include the computer 20.

While the functions mentioned herein may be described primarily in connection with performance by the system components 30-90, in a contemplated embodiment, one or more of the functions are performed by the computer 20.

Figure 3:
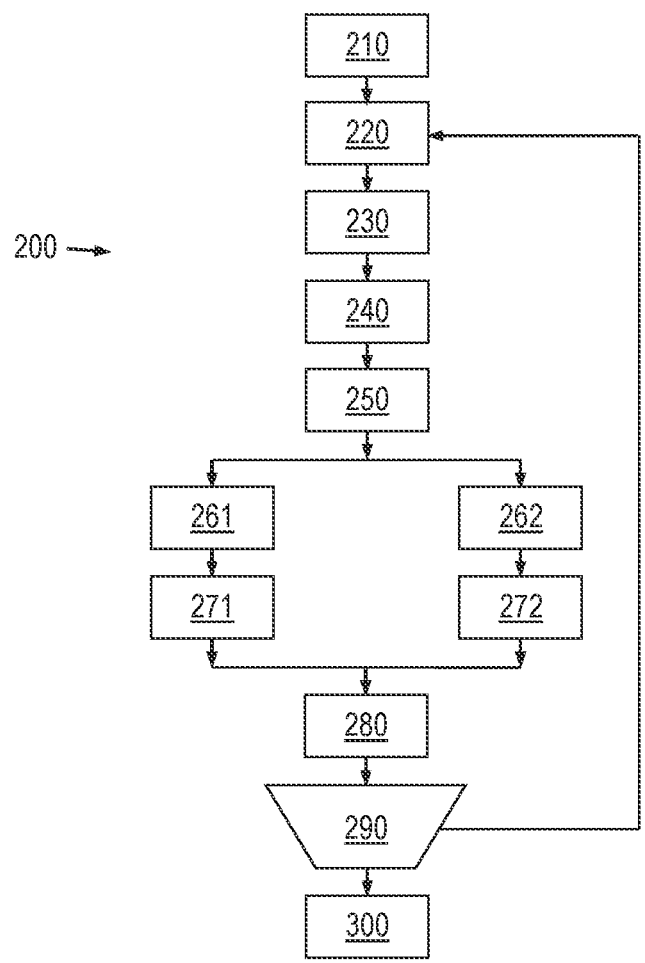
FIG. 3 is a flow chart illustration of a method for detecting partial discharge of a stator for an electric motor for a vehicle, in accordance with various embodiments.

FIG. 3 illustrates a method 200 for detecting partial discharge of a stator for an electric motor for a vehicle. The method 200 may include, at action block 210, connecting stator leads as is appropriate for testing the selected portion of the stator winding. The selected portion of the stator winding to be tested may be only a single hairpin, may include the entire winding of the stator, or may include any winding portion of an intermediate size.

At action block 220, the method 200 includes determining what selected voltage will be applied to the portion of the stator winding undergoing testing. For an initial test procedure within the method 200, a minimum voltage may be pre-selected or included in a testing program operated by the computer. In later iterations, the voltage may be increased over the last-tested voltage by a set or pre-determined amount or according to the program operated by the computer.

At action block 230, the method 200 includes generating an AC sinewave input signal with an AC function generator. At action block 240, the method 200 includes amplifying the AC sinewave input signal to an increased voltage to form the high voltage AC sinewave input signal at the voltage selected at action block 220.

The method 200 continues with selectively applying the high voltage AC sinewave input signal to the stator to energize the selected portion of the winding in the stator with the high voltage AC sinewave input signal at action block 250.

The method 200 further includes sensing a first resulting load signal occurring in the stator at action block 261. Further, at action block 271, the method includes forming a first filtered high frequency signal by filtering the first resulting load signal based on the high voltage AC sinewave input signal to indicate any partial discharge voltage occurring in the stator based on the high voltage AC sinewave input signal received and on the first resulting load signal.

The method 200 further includes sensing a second resulting load signal occurring in the stator at action block 262. Further, at action block 272, the method 200 includes forming a second filtered high frequency signal by filtering the second resulting load signal based on the high voltage AC sinewave input signal to indicate any partial discharge voltage occurring in the stator based on the high voltage AC sinewave input signal received and on the second resulting load signal.

As shown, at action block 280, the method 200 includes processing the first filtered signal and the second filtered signal to form a processed signal indicating whether partial discharge occurred.

The method 200 may continue with querying, at inquiry block 290, whether the processed signal indicates that partial discharge has occurred. If not, the method 200 is repeated with the high voltage AC sinewave input signal at an increased voltage by returning to action block 220. When the processed signal indicates that partial discharge has occurred, the method further includes identifying the increased voltage of the high voltage AC sinewave input signal that was applied when partial discharge occurred at action block 300.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method for detecting a partial discharge in a stator for an electric motor, the method comprising:
   generating an AC sinewave input signal with an AC function generator;
   amplifying the AC sinewave input signal to an increased voltage with an amplifier to form a high voltage AC sinewave input signal, wherein the increased voltage is at least 100 volts;
   applying the high voltage AC sinewave input signal to the stator and energizing at least one winding therein;
   sensing a first resulting load signal occurring in the stator with a first device;
   filtering the first resulting load signal to form a first high frequency signal indicating any partial discharge voltage occurring in the stator;
   sensing a second resulting load signal occurring in the stator with a second device;
   filtering the second resulting load signal to form a second high frequency signal indicating any partial discharge voltage occurring in the stator; and
   processing the first high frequency signal and the second high frequency signal to form a processed signal indicating whether partial discharge occurred.

2. The method of claim 1 wherein the first device is a high pass filter having a root mean square (rms) voltage rating of at least 3 KV, and wherein the method comprises: receiving, by the high pass filter, the high voltage AC sinewave input signal; and indicating, by the first high frequency signal, any partial discharge voltage occurring in the stator based on the high voltage AC sinewave input signal and on the first resulting load signal.

3. The method of claim 1 wherein the second device is an antenna.

4. The method of claim 1 comprising:
   filtering, by a first high pass filter, the first resulting load signal to form the first high frequency signal; and
   filtering, by a second high pass filter, the second resulting load signal to form the second high frequency signal.

5. The method of claim 1 comprising processing, by a digitizer, the first high frequency signal and the second high frequency signal to form the processed signal indicating whether partial discharge occurred.

6. The method of claim 1, wherein applying the high voltage AC sinewave input signal to the stator and energizing at least one winding therein comprises energizing each winding in the stator with the high voltage AC sinewave input signal.

7. The method of claim 1, wherein applying the high voltage AC sinewave input signal to the stator and energizing at least one winding therein comprises applying the high voltage AC sinewave input signal to a single selected hair pin in the stator and energizing only the single selected hair pin.

8. The method of claim 1 wherein the AC sinewave input signal has a voltage range of from −5 volts to +5 volts.

9. The method of claim 1 wherein the AC sinewave input signal is generated with a frequency of about 60 Hz.

10. The method of claim 1, wherein the AC sinewave input signal is generated with a voltage of less than 10 volts.

11. The method of claim 1 comprising, when the processed signal does not indicate that partial discharge has occurred, repeating the high voltage AC sinewave input signal at an increased voltage.

12. The method of claim 11 comprising, when the processed signal indicates that partial discharge has occurred, identifying the increased voltage of the high voltage AC sinewave input signal that was applied when partial discharge occurred.

13. A method for detecting a partial discharge in a stator for an electric motor, the method comprising:
  generating an AC sinewave input signal with an AC function generator, wherein the AC sinewave input signal has a first voltage;
  amplifying the AC sinewave input signal to an increased voltage with an amplifier to form a high voltage AC sinewave input signal, wherein the increased voltage more than ten times greater than the first voltage;
  selectively applying the high voltage AC sinewave input signal to the stator to either energize each winding in the stator with the high voltage AC sinewave input signal or to energize a single selected hair pin in the stator;
  sensing a first resulting load signal occurring in the stator and filtering the first resulting load signal to form a first high frequency signal;
  sensing a second resulting load signal with an antenna;
  filtering the second resulting load signal to form a second high frequency signal; and
  processing the first high frequency signal and the second high frequency signal to form a processed signal indicating whether partial discharge occurred.

14. The method of claim 13 comprising, when the processed signal does not indicate that partial discharge has occurred, repeating the high voltage AC sinewave input signal at an increased voltage.

15. The method of claim 14 comprising, when the processed signal indicates that partial discharge has occurred, identifying the increased voltage of the high voltage AC sinewave input signal that was applied when partial discharge occurred.

16. A system for detecting a partial discharge in a stator for an electric motor, the system comprising:
  an AC function generator configured to generate an AC sinewave input signal;
  an amplifier configured to amplify the AC sinewave input signal to form a high voltage AC sinewave input signal having a voltage of at least 100 volts;
  a stator lead configured to apply the high voltage AC sinewave input signal to the stator to energize at least one winding therein;
  a first device configured to sense a first resulting load signal occurring in the stator;
  a second device configured to sense a second resulting load signal occurring in the stator; and
  a module for processing the first resulting load signal and the second resulting load signal to form a processed signal indicating whether partial discharge occurred.

17. The system of claim 16 wherein the AC function generator is configured to generate the AC sinewave input signal with a voltage of less than 10 volts.

18. The system of claim 16 wherein the first device is a first high pass filter having a root mean square (rms) voltage rating of at least 3 KV, and wherein the second device is an antenna.

19. The system of claim 16 wherein the module for processing the first resulting load signal and the second resulting load signal to form the processed signal indicating whether partial discharge occurred comprises:
  a first high pass filter configured to: receive the high voltage AC sinewave input signal; receive the first resulting load signal; and filter the first resulting load signal to form a first high frequency signal indicating any partial discharge voltage occurring in the stator based on the high voltage AC sinewave input signal and on the first resulting load signal;
  a second high pass filter configured to filter the second resulting load signal to form a second high frequency signal indicating any partial discharge voltage occurring in the stator; and
  a digitizer configured to process the first high frequency signal and the second high frequency signal to form the processed signal indicating whether partial discharge occurred.

20. The system of claim 16 wherein the module for processing the first resulting load signal and the second resulting load signal to form the processed signal indicating whether partial discharge occurred comprises:
  a first high pass filter configured to: receive the high voltage AC sinewave input signal; receive the first resulting load signal; and filter the first resulting load signal to form a first high frequency signal indicating any partial discharge voltage occurring in the stator based on the high voltage AC sinewave input signal received and on the first resulting load signal;
  a second high pass filter configured to filter the second resulting load signal to form a second high frequency signal indicating any partial discharge voltage occurring in the stator; and
  a digitizer configured to process the first high frequency signal and the second high frequency signal to form the processed signal indicating whether partial discharge occurred; and wherein the system further comprises a controller configured to communicate with and control the AC function generator, the amplifier, the first device, the second device, the first high pass filter, the second high pass filter, and the digitizer.

* * * * *